(12) United States Patent
Nakiboglu et al.

(10) Patent No.: US 10,114,295 B2
(45) Date of Patent: Oct. 30, 2018

(54) LITHOGRAPHIC APPARATUS AND DEVICE MANUFACTURING METHOD

(71) Applicant: ASML NETHERLANDS B.V., Veldhoven (NL)

(72) Inventors: Günes Nakiboglu, Eindhoven (NL); Jan Steven Christiaan Westerlaken, Heesch (NL); Frank Johannes Jacobus Van Boxtel, Eindhoven (NL); Maria del Carmen Mercado, Budel-Schoot (NL); Thibault Simon Mathieu Laurent, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/520,193

(22) PCT Filed: Oct. 13, 2015

(86) PCT No.: PCT/EP2015/073681
§ 371 (c)(1),
(2) Date: Apr. 19, 2017

(87) PCT Pub. No.: WO2016/074876
PCT Pub. Date: May 19, 2016

(65) Prior Publication Data
US 2017/0261864 A1    Sep. 14, 2017

(30) Foreign Application Priority Data
Nov. 13, 2014    (EP) .................................... 14192938

(51) Int. Cl.
*G03F 7/20* (2006.01)
*G03F 9/00* (2006.01)

(52) U.S. Cl.
CPC .......... *G03F 7/70725* (2013.01); *G03F 7/709* (2013.01); *G03F 7/7085* (2013.01);
(Continued)

(58) Field of Classification Search
CPC ............. G03F 7/70858; G03F 7/70866; G03F 7/70983; G03F 7/70916; G03F 7/70883;
(Continued)

(56) References Cited

U.S. PATENT DOCUMENTS 6,233,040 B1 *    5/2001    Sekiguchi ........... G03F 7/70358
355/53
7,253,875 B1      8/2007    Luttikhuis et al.
(Continued)

FOREIGN PATENT DOCUMENTS

JP    03-127814    5/1991
JP    11-16828 A    1/1999
(Continued)

OTHER PUBLICATIONS

International Search Report and Written Opinion dated Jan. 28, 2016 in corresponding International Patent Application No. PCT/EP2015/073681.
(Continued)

*Primary Examiner* — Michelle M Iacoletti
(74) *Attorney, Agent, or Firm* — Pillsbury Winthrop Shaw Pittman, LLP

(57) ABSTRACT

A lithographic apparatus including: a projection system to project radiation onto a substrate supported on a substrate stage, during an exposure phase; a sensing system to sense a property of the substrate on the stage during a sensing phase; and a positioning system to determine a position of the stage relative to a reference system via a radiation path between the stage and the reference system, wherein the apparatus is configured to control stage movement relative
(Continued)

to the reference system in the sensing phase and to control other movement relative to the reference system during the exposure phase; the stage or reference system having an outlet to provide a gas curtain to reduce ingress of ambient gas into the path; and the apparatus is operative such that a characteristic of the gas curtain is different in at least part of the sensing phase compared to in the exposure phase.

21 Claims, 4 Drawing Sheets

(52) U.S. Cl.
CPC ...... *G03F 7/70808* (2013.01); *G03F 7/70858* (2013.01); *G03F 7/70933* (2013.01); *G03F 9/7096* (2013.01)

(58) Field of Classification Search
CPC ............. G03F 7/70725; G03F 7/70716; G03F 7/70808; G03F 9/7057
See application file for complete search history.

(56) References Cited

U.S. PATENT DOCUMENTS

| | | | |
|---|---|---|---|
| 7,602,489 | B2 | 10/2009 | Van Der Pasch et al. |
| 8,988,650 | B2 | 3/2015 | Westerlaken et al. |
| 2001/0028456 | A1 | 10/2001 | Nishi |
| 2004/0212791 | A1 | 10/2004 | De Bokx et al. |
| 2007/0002292 | A1 | 1/2007 | Vogel et al. |
| 2012/0052447 | A1 | 3/2012 | Westerlaken et al. |
| 2015/0227060 | A1* | 8/2015 | Beerens .................. G01D 5/38 355/30 |
| 2016/0349631 | A1* | 12/2016 | Nakiboglu .......... G03F 7/70358 |

FOREIGN PATENT DOCUMENTS

| | | |
|---|---|---|
| JP | 2007-251156 A | 9/2007 |
| JP | 2012-049531 A | 3/2012 |
| WO | 2014/044477 | 3/2014 |
| WO | 2014/128232 A1 | 8/2014 |
| WO | 2015/124344 | 8/2015 |

OTHER PUBLICATIONS

Notice of Reasons for Rejection dated Apr. 19, 2018 issued in corresponding Japanese Patent Application No. 2017-519843 with English translation.

\* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/073681, which was filed on Oct. 13, 2015, which claims the benefit of EP application no. 14192938.0, which was filed on Nov. 13, 2014, each of which are incorporated herein in its entirety by reference.

FIELD

The present invention relates to an atmospheric lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). The substrate may be supported on a substrate stage. Transfer of the pattern is typically during an exposure phase via imaging a patterned beam of radiation onto a layer of radiation-sensitive material (resist) provided on the substrate. A projection system is provided for projecting the patterned beam of radiation onto the target portion during the exposure phase. In general, a single substrate will contain a network of adjacent target portions that are successively patterned. Known lithographic apparatus include so-called steppers. In steppers each target portion is irradiated by exposing an entire pattern onto the target portion at one time. Other known lithographic apparatus include so-called scanners. In scanners each target portion is irradiated by scanning the pattern through a projection radiation beam in a given direction (the "scanning"-direction) while synchronously scanning the substrate parallel or anti-parallel to this given direction.

Before the exposure phase one or more properties of the substrate is/are sensed during a sensing phase. At least one of the one or more properties may be sensed by an alignment system. For example, a surface topography of the substrate may be measured during the sensing phase. This process is sometimes known as levelling or levelling scanning. Additionally or alternatively the property which is sensed may be the position of alignment marks on the substrate relative to other alignment marks provided on, e.g., the substrate stage on which the substrate is supported. This process is known as an alignment or alignment scanning. The properties sensed during the sensing phase are used during the exposure phase to ensure correct focus of the patterned beam of radiation on the substrate and/or correct positioning of the patterned beam of radiation on the substrate.

In one type of lithographic apparatus the substrate stage for supporting the substrate is in an environment with an ambient gas. Such a lithographic apparatus is called an atmospheric lithographic apparatus. In an atmospheric lithographic apparatus a liquid may be provided between the final element of the projection system and the substrate during the exposure phase. Such an apparatus is often referred to as an immersion lithographic apparatus.

The rate at which the lithographic apparatus applies the desired pattern on the substrate, known as throughput, is a major performance criterion in lithography apparatus. A higher throughput is desirable. Throughput is dependent on multiple factors. One factor on which throughput is dependent is the speed at which transfer of the pattern onto the substrate takes place. Another factor on which throughput is dependent is the speed at which properties of the substrate which need to be sensed prior to transfer of the pattern can be sensed. It is beneficial to have high moving speeds of the substrate during the exposure phase and/or during the sensing phase. However, it is important to maintain accuracy of measurements, particularly of determining the position of the substrate stage relative to the projection system, alignment system and/or alignment systems, at the high moving speeds.

Measurement radiation beams are used for determining the position of the substrate stage relative to the projection system, alignment system and/or alignment systems or an intermediate body such as a grid configured to cooperate with an encoder system or such as a reference frame. Measurement radiation beams in atmospheric lithographic apparatus pass through gas along a path of radiation. Local fluctuations in the characteristics of gas through which measurement radiation beams pass can affect the measurement radiation beam. Therefore, it is an aim of the present invention to provide an apparatus with reduced fluctuations in the characteristics of gas along the path of radiation.

SUMMARY OF THE INVENTION

According to an aspect of the invention, there is provided an atmospheric lithographic apparatus comprising: a substrate stage for supporting a substrate in an environment with an ambient gas; a projection system configured for subsequently projecting a patterned beam of radiation onto a plurality of target portions of the substrate on the substrate stage during an exposure phase; a sensing system for sensing a property of the substrate on the substrate stage during a sensing phase; a reference system; and a positioning system configured for determining a position of the substrate stage relative to the reference system via a path of radiation between the substrate stage and the reference system; wherein: the atmospheric lithographic apparatus is configured for controlling the substrate stage to undergo movement relative to the reference system in the sensing phase and to undergo other movement relative to the reference system during the exposure phase; at least the substrate stage or the reference system has an outlet system for providing a gas curtain of a barrier gas operative to reduce ingress of the ambient gas into a volume traversed by the path of radiation between the substrate stage and the reference system; and the lithographic apparatus is operative such that a characteristic of the gas curtain is different in at least part of the sensing phase compared to in the exposure phase.

According to an aspect of the invention, there is provided a device manufacturing method comprising: a sensing phase of sensing a property of a substrate on a substrate stage in an environment with an ambient gas; an exposure phase of exposing a pattern from a patterning device onto the substrate on the substrate stage; wherein in the sensing phase and in the exposure phase the position of the substrate stage relative to a reference system is determined via a path of radiation between the substrate stage and the reference system and a gas curtain of a barrier gas reduces ingress of the ambient gas into a volume traversed by the path of radiation between the substrate stage and the reference system; wherein: a characteristic of the gas curtain is different in at least part of the sensing phase compared to in the exposure phase.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
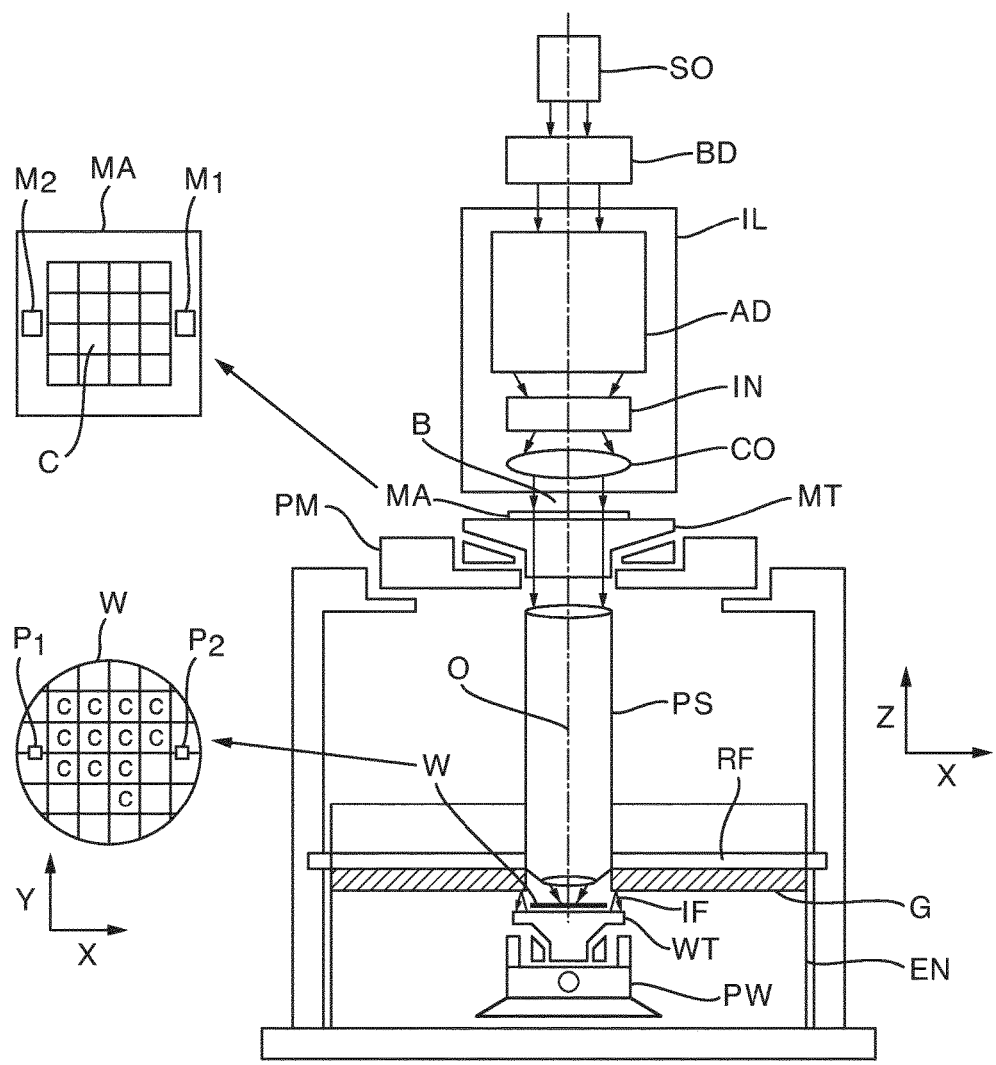
FIG. 1 depicts a lithographic apparatus according to an embodiment of the present invention.

FIG. 1 schematically depicts a lithographic apparatus according to one embodiment of the invention. The apparatus comprises:
- an illumination system (illuminator) IL configured to condition a radiation beam B (e.g. UV radiation).
- a support structure (e.g. a mask table) MT constructed to support a patterning device (e.g. a mask) MA and connected to a first positioner PM configured to accurately position the patterning device in accordance with certain parameters;
- a substrate stage (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a patterned beam of radiation (formed when a pattern is imparted to the radiation beam B by patterning device MA) onto a target portion C (e.g. comprising one or more dies) of the substrate W.

The atmospheric lithographic apparatus comprises an enclosure EN. The enclosure EN encloses at least the substrate stage WT. An ambient gas is present in the enclosure EN.

The illumination system IL may include various types of optical components, such as refractive components, reflective components, magnetic components, electromagnetic components, electrostatic components or other types of optical components, or any combination thereof, for directing radiation, shaping radiation, or controlling radiation.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a projection radiation beam with a pattern in its cross-section such as to create a pattern in a target portion C of the substrate W. It should be noted that the pattern imparted to the projection radiation beam may not exactly correspond to the desired pattern in the target portion C of the substrate W, for example if the pattern includes phase-shifting features or so called assist features. Generally, the pattern imparted to the radiation beam B to form the patterned beam of radiation will correspond to a particular functional layer in a device being created in the target portion C, such as an integrated circuit.

The lithographic apparatus may be of a type having two (dual stage) or more substrate stages WT (and/or two or more mask tables MT). In such "multiple stage" machines the additional substrate stage(s) WT and/or mask table(s) MT may be used in parallel. Alternatively preparatory steps may be carried out on one or more substrate stage(s) WT and/or mask table(s) MT while one or more other substrate stage(s) WT and/or mask table(s) MT are being used for transfer of the pattern onto the substrate W.

The lithographic apparatus may also be of a type wherein at least a portion of the substrate W may be covered by an immersion liquid having a relatively high refractive index, e.g. water, so as to fill a space between the projection system PS and the substrate W. Immersion techniques are well known in the art for increasing the numerical aperture of projection system PS. The term "immersion" as used herein does not mean that a structure, such as a substrate, must be submerged in immersion liquid, but rather only means that immersion liquid is located between the projection system PS and the substrate W during transfer of the pattern onto the substrate.

During an exposure phase, the radiation beam B is incident on the patterning device (e.g., mask MA), which is held on the support structure (e.g., mask table MT), and is patterned by the patterning device to form a patterned beam of radiation. Having traversed the mask MA, the patterned beam of radiation passes through the projection system PS, which projects the patterned beam of radiation onto a target portion C of the substrate W. With the aid of the second positioner PW and position sensor IF (e.g. a linear encoder with grid G as illustrated in FIG. 1), the substrate stage WT can be moved accurately, e.g. so as to position different target portions C in the path of the patterned beam of radiation. Similarly, the first positioner PM and another position sensor (which is not explicitly depicted in FIG. 1) can be used to accurately position the mask MA with respect to the path of the patterned beam of radiation, e.g. after mechanical retrieval from a mask library, or during a scan in a scanner. In general, movement of the mask table MT may be realized with the aid of a long-stroke module (coarse positioning) and a short-stroke module (fine positioning), which form part of the first positioner PM. Similarly, movement of the substrate stage WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks P1, P2 as illustrated occupy dedicated target portions C, they may be located in spaces between target portions C (these are known as scribe-lane alignment marks). Similarly, in situations in which more than one die is provided on the mask MA, the mask alignment marks P1, P2 may be located between the dies.

The depicted lithographic apparatus could be used in a scanning mode, i.e. as a scanner. In the scanning mode, the mask table MT and the substrate stage WT are scanned synchronously while the patterned beam of radiation is projected onto a target portion C (i.e. a single dynamic exposure). The velocity and direction of the substrate stage WT relative to the mask table MT may be determined by the (de-)magnification and image reversal characteristics of the projection system PS.

Before the exposure phase one or more properties of the substrate is/are sensed during a sensing phase. The surface topography of the substrate may be measured (often called leveling or leveling scanning) during the sensing phase. Additionally or alternatively the position of alignment marks on the substrate W relative to alignment marks on the substrate stage WT may be measured (often called alignment or alignment scanning) during the sensing phase. The properties sensed during the sensing phase are used during the exposure phase to ensure correct focus of the patterned beam of radiation on the substrate W and/or correct positioning of the patterned beam of radiation on the substrate W.

During the exposure phase and the sensing phase the position of the substrate stage WT relative to a reference system RF is determined. A positioning system is provided for determining the position of the substrate stage WT relative to the reference system RF. The positioning system determines the position of the substrate stage WT relative to the reference system RF via a path of radiation between the substrate stage WT and the reference system RF. By knowing (i) the position of the substrate stage WT relative to the reference system RF, (ii) the position of the reference system RF relative to the projection system PS, and (iii) the position of the substrate W relative to the substrate stage WT, the position of the substrate W relative to the patterned beam of radiation may be determined.

Figure 2:
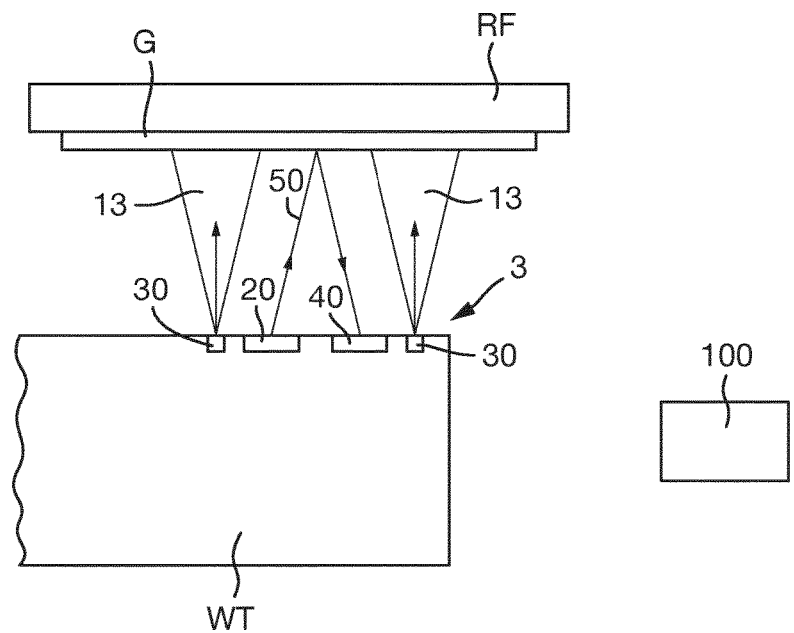
FIG. 2 is a cross-sectional view of a substrate stage of a lithographic apparatus.
Figure 3:
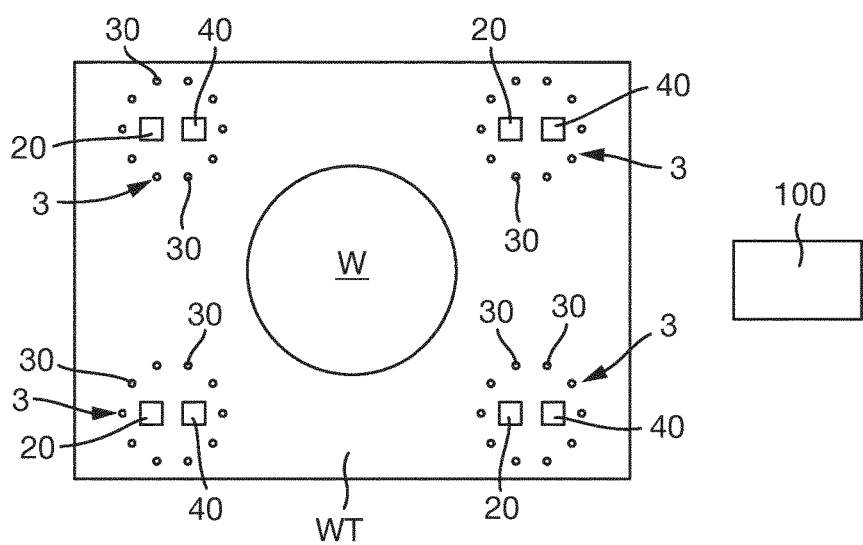
FIG. 3 is a plan view of the substrate stage of FIG. 2.

An embodiment of a positioning system for determining the position of the substrate stage WT relative to the reference system RF is depicted in FIGS. 2 and 3. FIGS. 2 and 3 are a side view and a plan view respectively of a substrate stage WT. The positioning system comprises a radiation source 20 for emitting a measurement radiation beam 50, and a sensor 40 for detecting the measurement radiation beam 50. The measurement radiation beam 50 is projected towards a grid G of the reference system RF. In this embodiment the position of the grid G relative to the projection system PS is known. In the embodiment illustrated, the reference system RF may be implemented by a reference frame, indicated here by the same acronym RF. The position of the grid G relative to the reference frame RF is known and may or may not be fixed. The relative position of the reference frame RF to the projection system PS is known. The position of the reference frame RF relative to the projection system PS may or may not be fixed. In this way the grid G is in a known position relative to the projection system PS. The measurement radiation beam 50 is reflected and/or refracted by the grid G back to the sensor 40. The measurement radiation beam 50 travels along a path of radiation. The sensor 40, configured to detect the measurement radiation beam 50, is used to indicate the position and/or movement of the grid G relative to the radiation source 20 and/or the sensor 40. The sensor 40 measures displacements of the substrate stage WT relative to the grid G. Therefore, the position of the substrate stage WT relative to the projection system PS can be determined. This is possible because the position of the grid G relative to the projection system PS is known as described above.

A respective combination of a radiation source 20 and a sensor 40 is most conveniently positioned at a respective one of the corners of the substrate stage WT, see e.g., the diagram of FIG. 3, explained further below. This convenient position is due to the center of the substrate stage WT being taken up by the substrate W. Furthermore, pairs of diametrically positioned combinations are involved in determining an angular displacement of the substrate stage WT about an axis parallel to the Z axis (see the diagram of FIG. 1). The angular displacement can be determined with higher accuracy if the distance between the diametrically positioned combinations is larger. For more background, see, e.g., U.S. Pat. No. 7,602,489 issued to Van der Pasch et al., and incorporated herein by reference.

As described above, the positioning system uses a measurement radiation beam 50. The measurement radiation beam 50 travels along the path of radiation. Ambient gas through which the measurement radiation beam 50 passes along the path of radiation may affect the measurement radiation beam 50.

Several factors can affect how the measurement radiation beam 50 propagates through a gas. For example, temperature of the gas, humidity of the gas and composition of the gas are factors which may affect the refractive index of a gas. Localised variations of these factors and turbulence in the gas can result in non-uniformities in the refractive index of the gas. The measurement radiation beam 50 passing through a gas is affected by variations in the refractive index. For example, a change in the refractive index can alter the trajectory of the measurement radiation beam 50. Additionally or alternatively, a change in the refractive index can introduce wavefront errors into the measurement radiation beam 50. Measurement errors can be induced by variations in the refractive index along the path of radiation. Measurement errors can lead to positioning inaccuracies in the positioning of components of the lithograph apparatus. Any such positioning inaccuracies can alter the placement of the patterned beam of radiation on the substrate W and so can have a detrimental effect on overlay and/or focus.

Known arrangements are in place to try to reduce the fluctuations in the refractive index of gas in a volume traversed by the path of radiation. For example, in an embodiment an outlet system 3 is provided. The outlet system 3 is configured to provide a gas curtain 13 of a barrier gas operative to reduce ingress of the ambient gas in the enclosure EN into the volume traversed by the path of radiation. Therefore, gas in the volume through which the measurement radiation beam 50 passes can be controlled.

A known outlet system 3 ejects barrier gas from at least one opening 30 in a surface of the substrate stage WT. The barrier gas forms a gas curtain 13 which impedes the flow of ambient gas on one side of the gas curtain 13. A gas curtain 13 can be provided around the volume such that the gas within the volume is effectively separated from the ambient gas outside the volume. The gas within the volume can be conditioned such that it is more uniform than the gas outside of the volume. Therefore, the gas curtain 13 can be used to provide a barrier around the volume traversed by the path of radiation of the measurement radiation beam 50. This protects the measurement radiation beam 50 from the effects of changes in ambient gas outside the volume. The gas within the volume is referred to as the protected gas.

Any unconditioned ambient gas which enters into the volume can affect the propagation of the measurement radiation beam 50 and induce errors. Outlet systems 3 use various different ways of preventing ambient gas from entering the volume using gas curtains 13. The different ways include, but are not limited to (i) providing a jet of barrier gas through a single set of openings 30 in the substrate stage WT and (ii) providing a turbulent flow of barrier gas through a first set of radially inward openings in the substrate stage WT surrounding the volume radially inwardly with respect to the volume of a laminar flow of thermally conditioned barrier gas provided through a second set of radially outward openings in the substrate stage WT. For completeness, it is remarked here that the flow of the barrier gas through the first set of radially inward openings may be turbulent or laminar.

However, tests on a known outlet system 3 have shown that as moving speed increases, more and more unconditioned ambient gas enters into the volume and contaminates the protected gas.

During relative movement of the substrate stage WT in the ambient gas of the enclosure EN, a flow of the ambient gas relative to the substrate stage WT is induced as follows. Movement of the substrate stage WT in the enclosure EN causes the ambient gas to be pushed out of the way of the substrate stage WT at a side of the substrate stage WT acting as the front side of the substrate stage WT during the movement. This pushing away creates an increase in pressure of the ambient gas at the front side of the substrate stage WT. The movement also causes a decrease in pressure of the ambient gas at a side of the substrate stage WT acting as a back side of the substrate stage WT during the movement. The difference in pressure of the ambient gas between the front side of the substrate stage WT and the back side of the substrate stage WT causes a flow of ambient gas from the front side to the back side of the substrate stage WT.

Any flow of ambient gas over the substrate stage WT imposes an inwards force on the gas curtain 13. The inwards force on the gas curtain 13 increases with increased velocity of the flow of ambient gas. The velocity of the flow of ambient gas increases with increasing velocity of the substrate stage WT relative to the enclosure EN. As the inwards force increases, ambient gas from outside the volume traversed by the path of radiation is forced into the volume. Gas entering into the volume in this way can be referred to as break-through.

At high moving speeds and/or at long movement durations, break-through of thermally unconditioned ambient gas into the volume can be significant. High moving speeds are desirable to increase throughput.

The present invention aims to reduce break-through whilst limiting the acoustic disturbances generated by the outlet system 3. The present invention is based on the insight that the type of movements performed by the substrate stage WT during different phases of operation of the atmospheric lithographic apparatus varies. For example, during the sensing phase, the substrate stage WT typically makes moves at higher velocities relative to the reference frame RF compared to during the exposure phase. A higher velocity of the substrate stage WT relative to the reference frame RF increases the chance of break-through. During the sensing phase the length of movements between changes in direction relative to the reference frame RF are much longer than during the exposure phase. The inventors have found that this gives any ambient gas flow more time to create sufficient instability in the gas curtain 13 thereby to achieve break-through. Additionally the directions of movement of the substrate stage WT relative to the reference frame RF are predominantly in one direction in the sensing phase and are more evenly distributed between different directions in the exposure phase.

Existing outlet systems 3 are optimised for the case where high constant velocities of the substrate stage WT relative to the reference frame RF occur for an infinitely long duration of movement in a given direction. To withstand such high constant velocities, high velocities of barrier gas relative to the outlet system 3 when exiting the outlet system 3 are used to create the gas curtain 13. High velocities of barrier gas relative to the outlet system 3 undesirably create acoustic disturbances in the apparatus. Acoustic disturbances are lower at lower barrier gas velocities relative to the outlet system 3.

In the present invention, different characteristics of the gas curtain 13 are used in at least part of the sensing phase compared to in the exposure phase. The different characteristics of the gas curtain 13 are optimised for the exposure phase and the at least part of the sensing phase to resist break-through whilst using as low as possible a velocity of barrier gas, thereby to reduce acoustic disturbances.

In an embodiment, during the transition between the sensing phase and the exposure phase, the characteristics of the gas curtain 13 are changed from one characteristic to another.

In further embodiments, the characteristics of the gas curtain 13 may be different during other phases or sub-phases of operation of the lithographic apparatus. An example of another phase is a moving phase during which the substrate stage WT moves between a position at which the sensing phase takes place and a position at which the exposure phase takes place. Examples of sub-phases of operation are levelling scanning and alignment scanning which are sub-phases of the sensing phase. Using a different gas curtain 13 characteristic between the levelling scanning and alignment scanning may be advantageous. This is because during an alignment scan the maximum speed of the substrate stage WT relative to the reference frame RF is different to (e.g., lower than) the maximum speed of the substrate stage WT relative to the reference frame RF during a levelling scan. In an embodiment, characteristics of the gas curtain 13 are the same for the exposure phase and the alignment scanning sub-phase of the scanning phase, but different for the levelling scanning sub-phase of the scanning phase.

The present inventors envisage two or more different characteristics of gas curtain 13 for different phases or sub-phase of operation of the lithographic apparatus.

In the present invention operating characteristics of the outlet system 3 (i.e., characteristics of the gas curtain 13) are varied according to the types of movement expected during the current phase of operation. The characteristics which are varied include: (i) the speed of the barrier gas relative to the outlet system 3 when exiting the outlet system 3, (ii) a volume of the barrier gas exiting the outlet system 3 per unit of time, and (iii) a spatial distribution, in plan, of the barrier gas when exiting the outlet system 3. In the case that the outflow area of the outlet system 3 does not change, (i) and (ii) are effectively the same. Varying the characteristic allows a reduction in the speed of the barrier gas relative to the outlet system 3 when exiting the outlet system 3 at least during (i) at least part of the sensing phase (e.g., during a sub-phase) and (ii) the exposure phase, compared to prior art machines. As a result acoustic disturbances resulting from the high speed of the barrier gas relative to the outlet system 3 when exiting the outlet system 3 are reduced during at least part of the sensing phase and/or during the exposure phase compared to prior art machines.

For movements which are more likely to result in break-through (high velocity and/or long distance between changes in direction), a higher barrier gas velocity exiting the outlet system 3 is used. At lower velocities and/or distances between changes in direction of movement of the substrate stage WT, lower barrier gas velocity exiting the outlet system 3 is used, thereby reducing acoustic disturbance.

A difference between the movements of the substrate stage WT relative to the reference system during at least part of the sensing phase and exposure phase is the predominate direction of travel relative to the reference frame RF of the substrate stage WT. Therefore, in the case that the geometry (e.g., spatial distribution) in plan of the gas curtain 13 formed by the barrier gas is not circular, different geometries and/or orientations of the gas curtain 13 may be more suited to one of the sensing phase or one of its sub-phases and the exposure phase than the other.

Several embodiments of outlet system 3 with outlet system controller 100 will now be described. Each of the embodiments may vary one or more of: the speed of the barrier gas relative to the outlet system 3 when exiting the outlet system 3, the volume of barrier gas exiting the outlet system 3 per unit of time, and the spatial distribution of the barrier gas when exiting the outlet system 3.

The invention is described below with reference to FIG. 2 in which the substrate stage WT accommodates at least one outlet system 3. The substrate stage WT is illustrated at an imaging location under the projection system PS. However, in an embodiment the at least one outlet system 3 may instead be part of the reference system RF and mounted substantially stationary relative to the projection system PS (e.g., accommodated on the reference frame RF) along with the radiation source 20 and sensor 40. In that embodiment, the grid G is not part of the reference system but moves with substrate stage WT and is in known position relative to the substrate stage WT (e.g., fixed to the substrate stage WT).

In an embodiment, a grid G which is part of the reference system is additionally at a measurement location. Properties of a substrate W mounted on the substrate stage WT such as position of the substrate W on the substrate stage WT, surface topography of the substrate W, etc., are measured at the measurement location. In this embodiment the grid G may be positioned above the substrate stage WT (similar to the main embodiment described above) or may be positioned on the substrate stage WT as described in the preceding paragraph.

On the substrate stage WT of FIG. 3, four outlet systems 3 can be seen. Other objects may be included on the substrate table WT which have not been shown, for example an object configured to hold a substrate W. Each outlet system 3 is configured to provide a gas curtain 13 operative to reduce an inflow of ambient gas into a volume traversed by the path of radiation between the substrate stage WT and the reference system RF. Each of the outlet systems 3 shown comprises at least one opening 30 in the substrate stage WT. The at least one opening 30 in the substrate stage WT is adapted for a flow of barrier gas therefrom for establishing the gas curtain 13 enclosing part of the volume traversed by the path of radiation.

FIG. 3 illustrates a first embodiment of outlet system 3. A plurality of individual openings 30 in an upper surface of the substrate stage WT surrounds the radiation source 20 and sensor 40. A controller 100 individually controls the flow of barrier gas out of each of the openings 30 of the outlet system 3. The controller 100 controls the speed of barrier gas exiting each of the openings 30 relative to the respective opening 30. The speed of barrier gas relative to the respective opening 30 may be the same for each of the plurality of openings 30. In an alternative embodiment the speed of the barrier gas relative to the respective opening 30 may vary between openings 30. For instance, any of openings 30 aligned with the radiation source 20 and/or sensor 40 in the principle directions of movement of the substrate stage WT may have a higher gas flow rate out of them than other openings 30. The controller 100 changes the speed of barrier gas relative to the respective opening 30 during the exposure phase compared to at least part of the sensing phase (e.g., the levelling scanning sub-phase). Because (i) the speed of the substrate stage WT relative to the reference system RF is lower during the exposure phase than during the part of the sensing phase, and (ii) the time between the changes in direction of movement of the substrate stage WT is lower during the exposure phase than during the at least part of the sensing phase (e.g., the levelling scanning sub-phase), the controller 100 decreases the speed of barrier gas exiting each of the openings 30 during the exposure phase compared to the part of the sensing phase (e.g., the levelling scanning sub-phase). As a result, any acoustic disturbances generated by the barrier gas are lower during the exposure phase than would be the case if the speed of barrier gas exiting each of the openings 30 relative to the respective opening 30 were not lower during the exposure phase.

Although the embodiment of FIG. 3 shows plural openings 30 per outlet system 3, a single elongate opening may be present instead.

The embodiment of FIG. 3 has been described above with reference to the speed relative to the opening 30 when exiting the outlet system 3. However, in an alternative embodiment, the controller 100 may instead control the volume of barrier gas exiting the openings 30 per unit of time.

Figure 4:
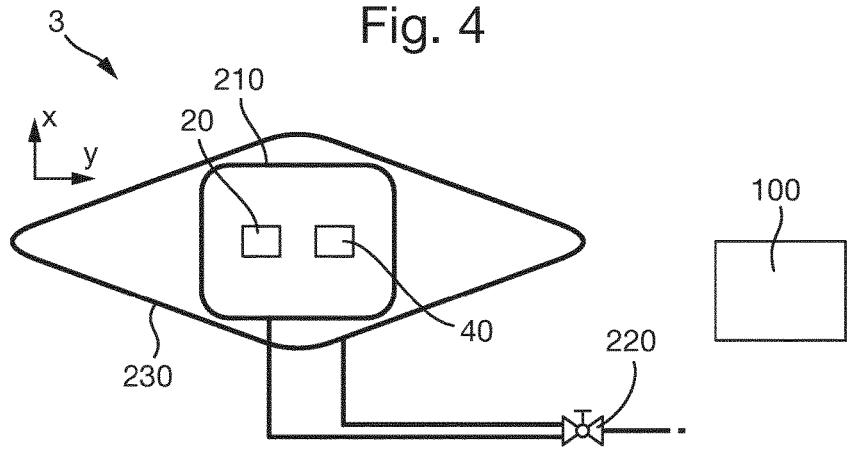
FIG. 4 is a plan view of an outlet system of a further embodiment.

FIG. 4 illustrates a further embodiment which is the same as the FIG. 3 embodiment except as described below. In the embodiment of FIG. 4, the outlet system 3 comprises a first elongate opening 210 and a second elongate opening 230. The controller 100 controls a valve 220 which selects whether barrier gas is provided to the first elongate opening 210 or the second elongate opening 230.

Each of the first elongate opening 210 and second elongate opening 230 surround the radiation source 20 and sensor 40. Each of the first elongate opening 210 and second elongate opening 230 may be provided as a groove or may be formed by a plurality of individual openings.

The geometry of the first elongate opening 210 is configured for use during the exposure phase. The geometry of the first elongate opening 210 is configured for a movement of the substrate stage WT which does not have a predominate direction of travel. That is, the geometry of the first elongate opening 210 is configured to provide a gas curtain 13 with good resistance to break-through during travel of the substrate stage WT in any horizontal direction (i.e., in the x y plane).

The geometry of the second elongate opening 230 is configured for use during at least part of the sensing phase (e.g., during the levelling scanning sub-phase). The geometry of the second elongate opening 230 is configured to provide a gas curtain 13 which is especially resistant to break-through during movement in the left and right direction as illustrated. This is the predominant direction of movement of the substrate stage WT during at least part of the sensing phase (e.g., during the levelling scanning sub-phase). Therefore, for a given speed of barrier gas relative to the outlet system 3 when exiting the outlet system 3, the geometry of the second elongate opening 230 provides higher resistance to break-through during movement to the right and left as illustrated than the geometry of the first elongate opening 210.

As in the embodiment of FIG. 3 and all other embodiments, the controller 100 may vary the speed of the barrier gas relative to the outlet system 3 when exiting the outlet system 3 and/or the volume of barrier gas exiting the outlet system 3 per unit of time. The controller 100 may vary the speed and/or volume depending on whether in the exposure phase or in a certain part of the sensing phase (e.g., the levelling scanning sub-phase).

Figure 5:
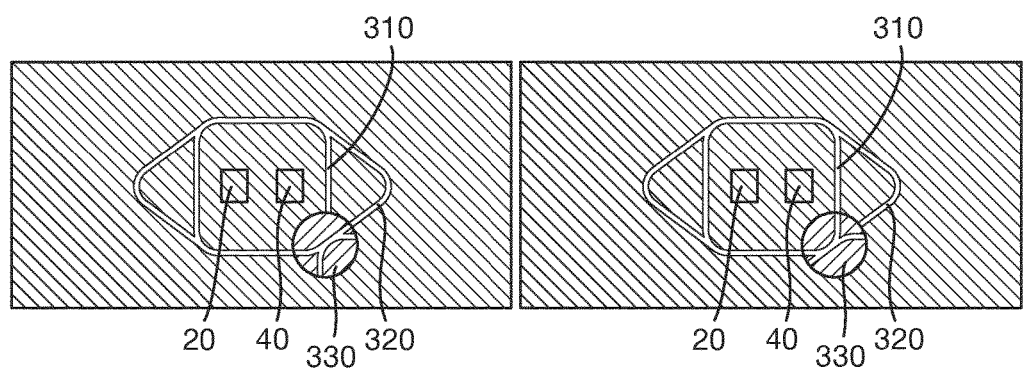
FIG. 5 is two plan views of an outlet system of a further embodiment.

FIG. 5 illustrates, in plan, a further embodiment of an outlet system 3. The embodiment of FIG. 5 is the same as that of FIG. 3 except as described below. The concept is similar to that of the FIG. 4 embodiment in that the barrier gas is provided through openings with a different geometry in at least part of the sensing phase (e.g. in the levelling scanning sub-phase) to the geometry of the openings through which the barrier gas is provided in the exposure phase (and optionally during the remaining part of the sensing phase).

A plurality of elongate openings are provided. The controller 100 controls to which of the plurality of openings barrier gas is supplied. An inner opening 310 and an outer opening 320 are provided. The inner opening 310 has a shape, in plan, of a square. The outer opening 320 is in the form of two V shapes on their side pointing away from the radiation source 20 and sensor 40 in the directions of predominate travel of the substrate stage WT during at least part of the sensing phase (e.g., during the levelling scanning sub-phase). Four flow directors 330 are provided, one at each corner of the inner opening 310 (though only one is illustrated in FIG. 5 for improved clarity). Upon reorientation of the flow directors 330 under control of the controller 100, a first outlet geometry or second outlet geometry can be selected. In the left hand side of FIG. 5, the first outlet geometry which has pointed sides is illustrated as being selected which is chosen for use during the sensing phase. The first geometry is made up of the outer openings 320 and top and bottom parts of the inner opening 310. On the right hand side of FIG. 5 the flow directors 330 are re-orientated to select the second outlet geometry which has a substantially square shape. The second outlet geometry is comprised of all of the inner opening 310 and none of the outer opening 320. The second outlet geometry of the right hand side of FIG. 5 is used in the exposure phase (and optionally during part of the sensing phase). Each of the flow directors 330 are re-orientated during at least part of the sensing phase (e.g., during the levelling scanning sub-phase) so as to shift the geometry from the second outlet geometry to the first outlet geometry.

Figure 6:
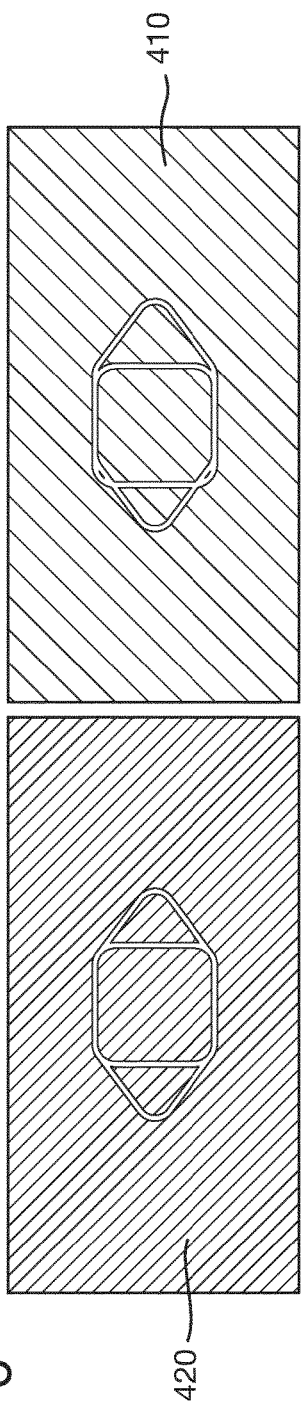
FIG. 6 is plan views of a first layer and a second layer of a further embodiment.
Figure 7:
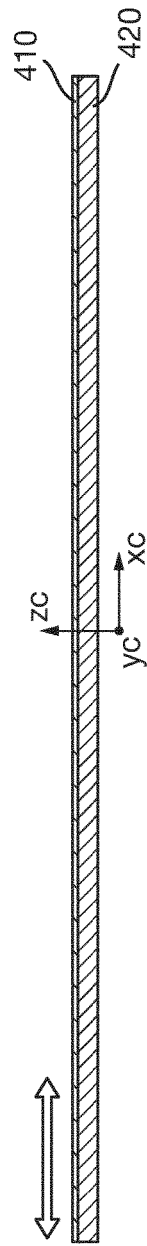
FIG. 7 is a cross-sectional view of the outlet system of FIG. 6.
Figure 8:
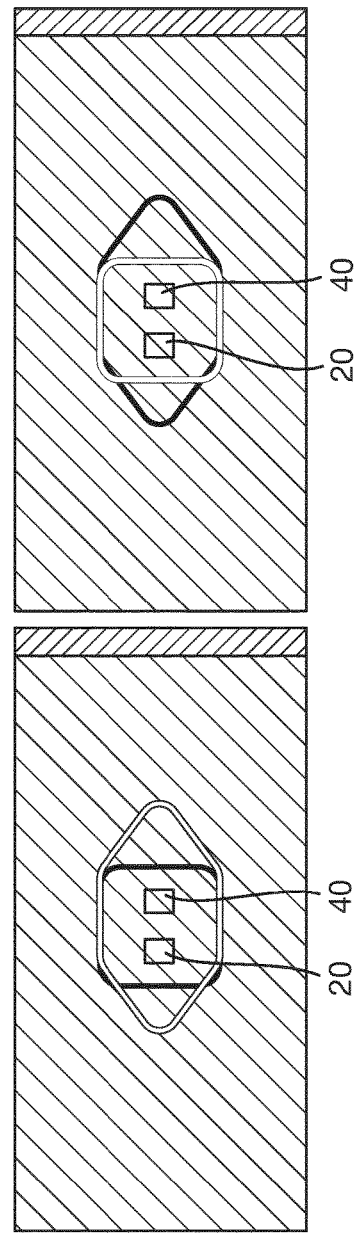
FIG. 8 shows the two positions of the upper layer and lower layer of FIGS. 6 and 7.

FIG. 6 shows an upper layer 410 and lower layer 420 of a further embodiment of an outlet system 3, in plan. FIG. 7 shows the embodiment of FIG. 6 in cross-section and FIG. 8 shows the upper layer 410 and lower layer 420 one on top of another in plan. The embodiment of FIGS. 6-8 is similar to that of FIG. 5 in that the geometry of the openings through which barrier gas is supplied can be changed between a first outlet geometry for use during at least part of the sensing phase (e.g., during the levelling scanning sub-phase) and a second outlet geometry for use during the exposure phase.

In the embodiment of FIGS. 6-8 an upper layer 410 and a lower layer 420 are provided one on top of the other. Movement of the upper layer 410 relative to the lower layer 420 changes the geometry of the openings through which barrier gas is provided. A translational motion of the upper layer 410 relative to the lower layer 420 between the exposure phase and at least part of the sensing phase (e.g. the levelling scanning sub-phase) allows for a change in outlet geometry.

The lower layer 420 is shown on the left hand side of FIG. 6. Openings of the first geometry and of the second geometry are present, both centred with respect to their position relative to the radiation source 20 and sensor 40.

The right hand side of FIG. 6 shows the upper layer 410. Openings of the first outlet geometry and of the second outlet geometry are provided. However, the first outlet geometry and second outlet geometry are off set from one another with respect to the radiation source 20 and sensor 40. When the upper layer 410 and lower layer 420 are placed one on top of another, and barrier gas is provided at pressure underneath them, by moving the upper layer 410 relative to the lower layer 420 it is possible to select through which parts of the openings in the upper layer 410 barrier gas is allowed to flow.

A lithographic apparatus in accordance with at least one of the above embodiments can be used in a device manufacturing method to irradiate a substrate using a projection radiation beam.

In an embodiment, there is provided an atmospheric lithographic apparatus comprising: a substrate stage for supporting a substrate in an environment with an ambient gas; a projection system configured for subsequently projecting a patterned beam of radiation onto a plurality of target portions of the substrate on the substrate stage during an exposure phase; a sensing system for sensing a property of the substrate on the substrate stage during a sensing phase; a reference system; and a positioning system configured for determining a position of the substrate stage relative to the reference system via a path of radiation between the substrate stage and the reference system; wherein: the atmospheric lithographic apparatus is configured for controlling the substrate stage to undergo movement relative to the reference system in the sensing phase and to undergo other movement relative to the reference system during the exposure phase; at least the substrate stage or the reference system has an outlet system for providing a gas curtain of a barrier gas operative to reduce ingress of the ambient gas into a volume traversed by the path of radiation between the substrate stage and the reference system; and the lithographic apparatus is operative such that a characteristic of the gas curtain is different in at least part of the sensing phase compared to in the exposure phase.

In an embodiment, the characteristic comprises at least one of the following: a speed of the barrier gas relative to the outlet system when exiting the outlet system; a volume of the barrier gas exiting the outlet system per unit of time; and a spatial distribution of the barrier gas when exiting the outlet system.

In an embodiment, there is provided a device manufacturing method comprising: a sensing phase of sensing a property of a substrate on a substrate stage in an environment with an ambient gas; an exposure phase of exposing a pattern from a patterning device onto the substrate on the substrate stage; wherein in the sensing phase and in the exposure phase the position of the substrate stage relative to a reference system is determined via a path of radiation between the substrate stage and the reference system and a gas curtain of a barrier gas reduces ingress of the ambient gas into a volume traversed by the path of radiation between the substrate stage and the reference system; wherein a characteristic of the gas curtain is different in at least part of the sensing phase compared to in the exposure phase.

In an embodiment, the characteristic comprises at least one of the following: a speed of the barrier gas relative to the substrate stage; a volume of the barrier gas exiting an outlet system for providing the gas curtain per unit of time; and a spatial distribution of the barrier gas relative to the substrate stage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or more processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The invention has been explained in this text and in the accompanying diagrams with reference to a specific configuration of a lithographic apparatus, which has a grid G at a reference system RF and which has respective combinations of a respective radiation source 20 and of a respective sensor 40 accommodated at the substrate stage WT. The invention is likewise applicable to another configuration of a lithographic apparatus, which has a grid G at the substrate stage WT and which has respective combinations of a respective radiation source 20 and of a respective sensor 40 accommodated at the reference system RF.

The terms "radiation" and "beam" used herein encompass all types of electromagnetic radiation, including ultraviolet (UV) radiation (e.g. having a wavelength of or about 436, 405, 365, 355, 248, 193, 157 or 126 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a substrate stage configured to support a substrate in an environment with an ambient gas;
   a projection system configured to project a beam of radiation onto the substrate when supported on the substrate stage during an exposure phase;
   a sensing system configured to sense a property of the substrate on the substrate stage during a sensing phase;
   a reference system; and
   a positioning system configured to determine a position of the substrate stage relative to the reference system via a path of radiation between the substrate stage and the reference system;
   wherein:
   the lithographic apparatus is configured to control the substrate stage to undergo movement relative to the reference system in the sensing phase and to undergo other movement relative to the reference system during the exposure phase;
   at least the substrate stage or the reference system has an outlet system configured to provide a gas curtain of a barrier gas operative to reduce ingress of the ambient gas into a volume traversed by the path of radiation between the substrate stage and the reference system; and
   the lithographic apparatus is configured to provide a characteristic of the gas curtain to be different in at least part of the sensing phase compared to in the exposure phase, wherein the characteristic comprises a spatial distribution of the barrier gas when exiting the outlet system and the lithographic apparatus is configured to provide the spatial distribution of the barrier gas when exiting the outlet system to be different in at least part of the sensing phase compared to in the exposure phase.

2. The lithographic apparatus of claim 1, wherein the characteristic further comprises at least one selected from:
   a speed of the barrier gas relative to the outlet system when exiting the outlet system; and/or
   a volume of the barrier gas exiting the outlet system per unit of time.

3. The lithographic apparatus of claim 1, wherein the outlet system is configured to provide a gas curtain having a different geometry around the path during at least part of the sensing phase than in the exposure phase.

4. The lithographic apparatus of claim 3, wherein the gas curtain during at least part of sensing phase is created using a first opening of the outlet system or using a first combination of openings of the outlet system and the gas curtain in the exposure phase is created using a second opening of the outlet system different than the first opening or using a second combination of openings of the outlet system different than the first combination of openings.

5. The lithographic apparatus of claim 3, wherein the geometry of the gas curtain during at least part of the sensing phase has a dimension approximately equal in two orthogonal directions and the geometry of the gas curtain in the exposure phase has different dimensions in two orthogonal directions.

6. The lithographic apparatus of claim 1, wherein the lithographic apparatus is configured to provide the spatial distribution of the barrier gas when exiting the outlet system to be different in at least part of the sensing phase compared to in the exposure phase such that an area spanned by the gas curtain is different in at least part of the first phase compared to in the second phase.

7. The lithographic apparatus of claim 1, wherein the lithographic apparatus is configured to provide a shape of the gas curtain forms a pointed shape with a point thereof pointing in a major direction of movement of the substrate stage.

8. A device manufacturing method comprising:
- a sensing phase of sensing a property of a substrate on a substrate stage in an environment with an ambient gas;
- an exposure phase of exposing a pattern from a patterning device onto the substrate on the substrate stage;
- wherein in the sensing phase and in the exposure phase the position of the substrate stage relative to a reference system is determined via a path of radiation between the substrate stage and the reference system and a gas curtain of a barrier gas reduces ingress of the ambient gas into a volume traversed by the path of radiation between the substrate stage and the reference system,
- wherein a characteristic of the gas curtain is different in at least part of the sensing phase compared to in the exposure phase, and
- wherein the characteristic comprises a spatial distribution of the barrier gas when exiting the outlet system and the spatial distribution of the barrier gas when exiting the outlet system is different in at least part of the sensing phase compared to in the exposure phase.

9. The device manufacturing method of claim 8, wherein the characteristic further comprises at least one selected from:
- a speed of the barrier gas relative to the substrate stage; and/or
- a volume of the barrier gas exiting an outlet system for providing the gas curtain per unit of time.

10. The device manufacturing method of claim 8, wherein the gas curtain has a different geometry around the path during at least part of the sensing phase than in the exposure phase.

11. The device manufacturing method of claim 10, wherein the geometry of the gas curtain during at least part of the sensing phase has a dimension approximately equal in two orthogonal directions and the geometry of the gas curtain in the exposure phase has different dimensions in two orthogonal directions.

12. The method of claim 8, wherein the spatial distribution of the barrier gas when exiting the outlet system is different in at least part of the sensing phase compared to in the exposure phase such that an area spanned by the gas curtain is different in at least part of the first phase compared to in the second phase.

13. The method of claim 8, wherein a shape of the gas curtain forms a pointed shape with a point thereof pointing in a major direction of movement of the substrate stage.

14. A lithographic apparatus comprising:
- a substrate stage configured to support a substrate in an environment with an ambient gas;
- a projection system configured to project a beam of radiation onto the substrate when supported on the substrate stage during an exposure phase;
- a sensing system configured to sense a property of the substrate on the substrate stage during a sensing phase;
- a reference system; and
- a positioning system configured to determine a position of the substrate stage relative to the reference system via a path of radiation between the substrate stage and the reference system;
- wherein:
- the lithographic apparatus is configured to control the substrate stage to undergo movement relative to the reference system in a first phase and to undergo other movement relative to the reference system during a second phase;
- at least the substrate stage or the reference system has an outlet system configured to provide a gas curtain of a barrier gas operative to reduce ingress of the ambient gas into a volume traversed by the path of radiation between the substrate stage and the reference system; and
- the lithographic apparatus is configured to provide a characteristic of the gas curtain to be different in at least part of the first phase compared to in the second phase, wherein the characteristic comprises an area spanned by the gas curtain and the lithographic apparatus is configured to provide the area spanned by the gas curtain to be different in at least part of the first phase compared to in the second phase.

15. The lithographic apparatus of claim 14, wherein the first phase is a first sub-phase of the sensing phase and the second phase is a second sub-phase of the sensing phase.

16. The lithographic apparatus of claim 14, wherein the lithographic apparatus is operative such that a characteristic of the gas curtain is different in at least part of the exposure phase compared to in the first and/or second phase.

17. The lithographic apparatus of claim 14, wherein the characteristic further comprises at least one selected from:
- a speed of the barrier gas relative to the outlet system when exiting the outlet system; and/or
- a volume of the barrier gas exiting the outlet system per unit of time.

18. The lithographic apparatus of claim 14, wherein the outlet system is configured to provide a gas curtain having a different geometry around the path during at least part of the sensing phase than in the exposure phase.

19. The lithographic apparatus of claim 18, wherein the gas curtain during at least part of sensing phase is created using a first opening of the outlet system or using a first combination of openings of the outlet system and the gas curtain in the exposure phase is created using a second opening of the outlet system different than the first opening or using a second combination of openings of the outlet system different than the first combination of openings.

20. The lithographic apparatus of claim 14, wherein the lithographic apparatus is configured to provide a shape of the gas curtain that forms a pointed shape with a point thereof pointing in a major direction of movement of the substrate stage.

21. The lithographic apparatus of claim 14, wherein the lithographic apparatus is configured to provide a geometry of the gas curtain during at least part of the sensing phase having a dimension approximately equal in two orthogonal directions and a geometry of the gas curtain in the exposure phase having different dimensions in two orthogonal directions.

* * * * *

UNITED STATES PATENT AND TRADEMARK OFFICE
CERTIFICATE OF CORRECTION

PATENT NO. : 10,114,295 B2
APPLICATION NO. : 15/520193
DATED : October 30, 2018
INVENTOR(S) : Günes Nakiboglu et al.

It is certified that error appears in the above-identified patent and that said Letters Patent is hereby corrected as shown below:

On the Title Page

Item (72) Inventors:
Please correct "Maria del Carmen Mercado" to the following correct inventor name of Maria del Carmen Mercado Carmona Signed and Sealed this
Twenty-second Day of January, 2019

Andrei Iancu
*Director of the United States Patent and Trademark Office*